United States Patent
Prein

[11] Patent Number: 6,070,004
[45] Date of Patent: *May 30, 2000

[54] METHOD OF MAXIMIZING CHIP YIELD FOR SEMICONDUCTOR WAFERS

[75] Inventor: Frank Prein, Glen Allen, Va.

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/937,764

[22] Filed: Sep. 25, 1997

[51] Int. Cl.$^7$ ............................. G06F 17/50; G06F 19/00; G06K 9/03
[52] U.S. Cl. .................... 395/500.11; 700/110; 700/121; 702/84; 702/181; 382/149
[58] Field of Search ..................................... 364/488–491, 364/578, 468.16, 468.17, 468.28; 395/500.02–500.22; 382/149, 145; 438/12; 702/84, 178–185

[56] References Cited

U.S. PATENT DOCUMENTS

| | | | |
|---|---|---|---|
| 3,751,647 | 8/1973 | Maeder et al. | 235/151.11 |
| 3,842,491 | 10/1974 | Depuy et al. | 235/151.11 |
| 4,488,806 | 12/1984 | Takahashi et al. | 355/77 |
| 4,841,893 | 11/1998 | Ishikawa et al. | 382/145 |
| 5,347,465 | 9/1994 | Ferreri et al. | 364/488 |
| 5,430,734 | 7/1995 | Gilson | 371/22.2 |
| 5,539,652 | 7/1996 | Tegethoff | 364/490 |
| 5,578,532 | 11/1996 | van de Ven et al. | 437/245 |
| 5,609,719 | 3/1997 | Hempel | 156/636.1 |
| 5,620,525 | 4/1997 | van de Ven et al. | 118/728 |
| 5,699,260 | 12/1997 | Lucas et al. | 364/468.28 |
| 5,777,901 | 7/1998 | Berezin et al. | 364/578 |

FOREIGN PATENT DOCUMENTS 0 854 430 A2 of 0000 European Pat. Off. ........ G06F 17/50
32 47 141 A1 of 0000 Germany ............................. B41J 3/21

OTHER PUBLICATIONS

Patent Abstracts of Japan, Publication No. 09027445, dated Jan. 28, 1997.
Patent Abstracts of Japan, Publication No. 07211622, dated Aug. 11, 1994.

*Primary Examiner*—Kevin J. Teska
*Assistant Examiner*—Phallaka Kik
*Attorney, Agent, or Firm*—Stanton C. Braden

[57] ABSTRACT

A method of fabricating semiconductor chips includes the steps of optimizing a number of chips that geometrically fit on a wafer and maximizing chip yield for the wafer by considering chips located in a normally rejectable location and utilizing yield probability data for the chip in the normally rejectable locations to weight the probability of an acceptable chip such that if the probability is above a threshold value the chips are not rejected. This results in an increased chip yield for semiconductor wafers.

12 Claims, 4 Drawing Sheets

METHOD OF MAXIMIZING CHIP YIELD FOR SEMICONDUCTOR WAFERS

BACKGROUND

1. Technical Field

This disclosure relates to semiconductor wafers and more particularly, to a method of maximizing the overall yield of chips per wafer.

2. Description of the Related Art

Semiconductor crystal wafers, such as those made of silicon, are used as a substrate for processing integrated circuit chips. As processing has improved over the years wafer diameters have increased to their current size of approximately 8 inches and greater. Wafers are generally sliced off from a large silicon crystal ingot and are therefore generally circular in shape.

Decreasing feature size for integrated circuit chips has increased the criticality of the planarity of the wafer. Today, with 0.35 micron features becoming widespread, surface planarity is assuming new importance, since it offers the key to boosting performance.

Chemical mechanical polishing (CMP) is a process for improving the surface planarity of a semiconductor wafer and involves the use of mechanical pad polishing systems usually with a silica-based slurry. CMP offers a practical approach to achieving the important advantage of global wafer planarity. However, CMP systems for global planarization have certain limitations. These limitations include low wafer throughput, polished surface non-uniformity and a problem related to polishing uniformity known as "edge exclusion". Edge exclusion occurs when too much of the semiconductor wafer is polished. This causes the edge or outer portion of the wafer to be unusable for integrated circuit fabrication. Wafer polish throughput and polish uniformity are important process parameters, because they also directly affect the number of integrated circuit chips that a fabrication facility can produce for a given period of time.

As mentioned above wafers are circular in shape. Integrated circuit chips are rectangular or square in shape. Since the integrated circuit chips are formed on the wafer, there are areas of the wafer that cannot be used based on the geometry mismatch alone. The area of unused space is further increased due to increased edge exclusion on the wafer. In addition to polishing, edge exclusions can be created by wafer handling devices. An edge exclusion can be defined on a given wafer by handling marks on that wafer. For example, a handling mark that extends further inward from the edge of the wafer than the polishing edge, defines the edge exclusion for that wafer. Edge exclusions tend to measure 2 to 8 millimeters radially outward from the innermost useable diameter to the edge of the wafer.

Typically, methods are used to maximize the amount of available useable area for chips on the semiconductor wafer. One such method attempts to maximize the number of good chips obtainable from a wafer by changing the center point of the wafer map. Referring to FIG. 1, a semiconductor wafer 10 is shown. A wafer map 20 is a layout of integrated circuit chips 12 on a wafer 18 which accounts for cuts between the chips as well. Wafer map 20 is fixed in defining the locations of individual chips 12 relative to one another. Wafer modeling programs are given a wafer map center point 16 and a given edge exclusion as input. The distance between point A and point B is the edge exclusion for wafer 18. An exclusion zone 14 is created at the outside of the wafer. A chip 12 that passes 3 mm past a diameter 22 is considered unusable. The wafer modeling program moves the wafer map by adjusting center point 16 within the region defined by diameter 22 until the maximum number of useable chips is achieved for a given edge exclusion.

Although this method gives the yield for the number of chips with a given edge exclusion, the number of usable chips per wafer may drop off significantly for slightly increased edge exclusions. For example, chips 12a, 12b and 12c are shown with corners in exclusion zone 14. If the edge exclusion is larger these chips may be deemed unusable by the prior art wafer modeling technique. However, some of the chips that extend into exclusion zone 14 may be usable since the yield probability for chips increases with decreasing wafer radius. This means that chips eliminated based on geometry alone may in fact be useable.

Therefore, a need exists for increasing the yield of semiconductor wafers based on the actual yield due to a given edge exclusion.

SUMMARY OF THE INVENTION

A method of fabricating semiconductor chips includes the steps of optimizing a number of chips that geometrically fit on a wafer and maximizing chip yield for the wafer by considering chips located in a normally rejectable location and utilizing yield probability data for the chip in the normally rejectable locations to weight the probability of an acceptable chip such that if the probability is above a threshold value the chips are not rejected. This results in an increased chip yield for semiconductor wafers.

In particularly preferred methods of fabricating semiconductor chips the step of optimizing a number of chips that geometrically fit on a wafer includes providing a predetermined wafer map for overlaying the wafer, the wafer map being referenced from a center point thereon and maximizing a first quantity of chips that can fit on the wafer by varying the center point of the wafer map on the wafer. The step of maximizing chip yield includes determining the quantity of chips that can fit on the wafer by varying an edge exclusion distance with a wafer map fixed at a maximized center point location, providing a yield probability curve for wafer map locations, multiplying the yield probability curve by the quantity of chips at each of the wafer map locations to obtain a weighted yield probability curve for each wafer map center point location, comparing alternative the weighted probability curves for different wafer map center point locations, and selecting the wafer map center point location to maximize the chip yield for the wafer. The steps of optimizing a number of chips that geometrically fit on a wafer and maximizing chip yield for the wafer may be performed by a computer.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present disclosure describes a method for maximizing the chip yield for a semiconductor wafer. By introducing yield probability data into a wafer modeling program the number of usable chips can be increased for a wafer. The present method typically improves the yield in situations where an edge exclusion for a wafer is relatively larger. The method takes yield data collected for a given type of chip and weights the chip location on the wafer in accordance with the yield data. Since large edge exclusions equate to chips deemed unusable in the prior art technique, the weighting of yield probability saves some of these chips based on their location on the wafer. This results in a larger number of chips for a given wafer.

Figure 1:
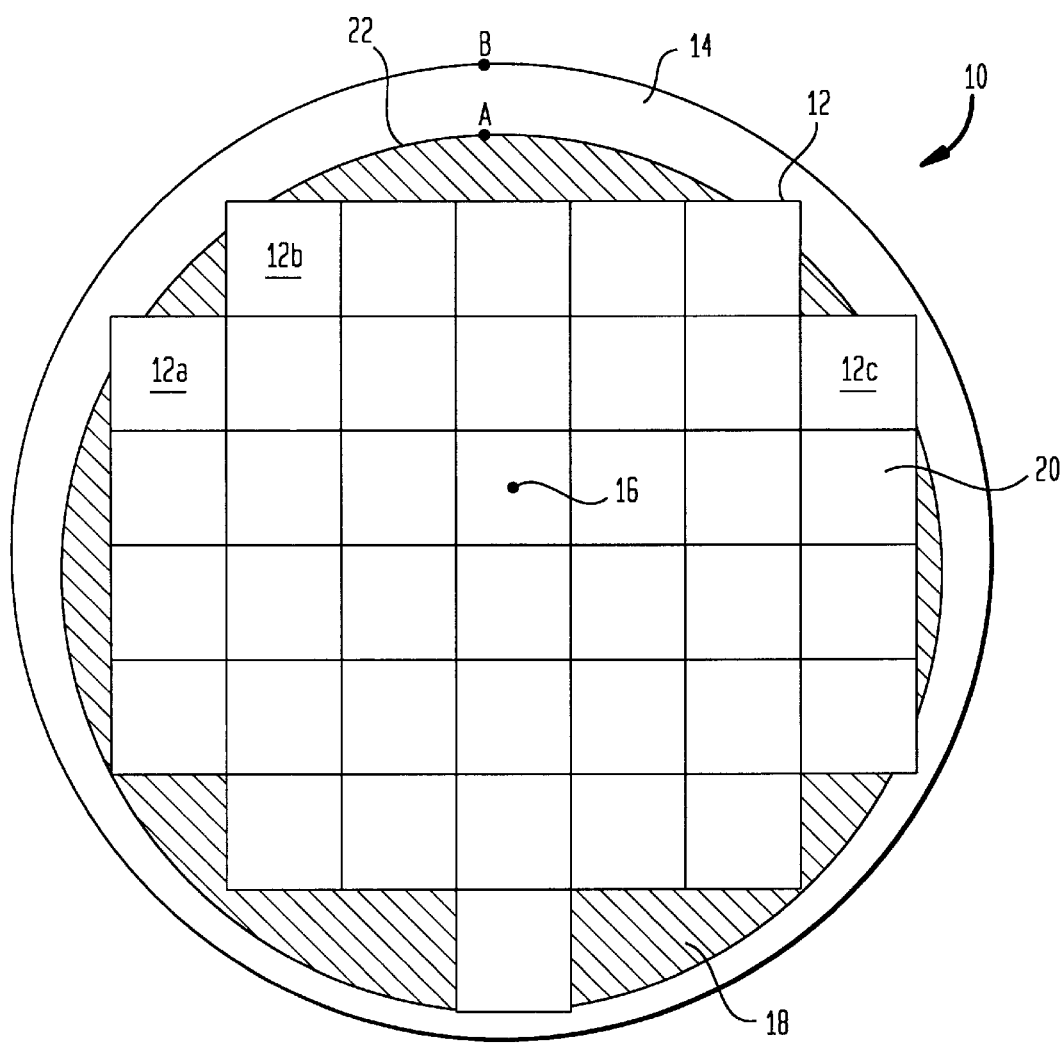
FIG. 1 is a plan view of a wafer having a wafer map with chip locations disposed thereon.
Figure 2:
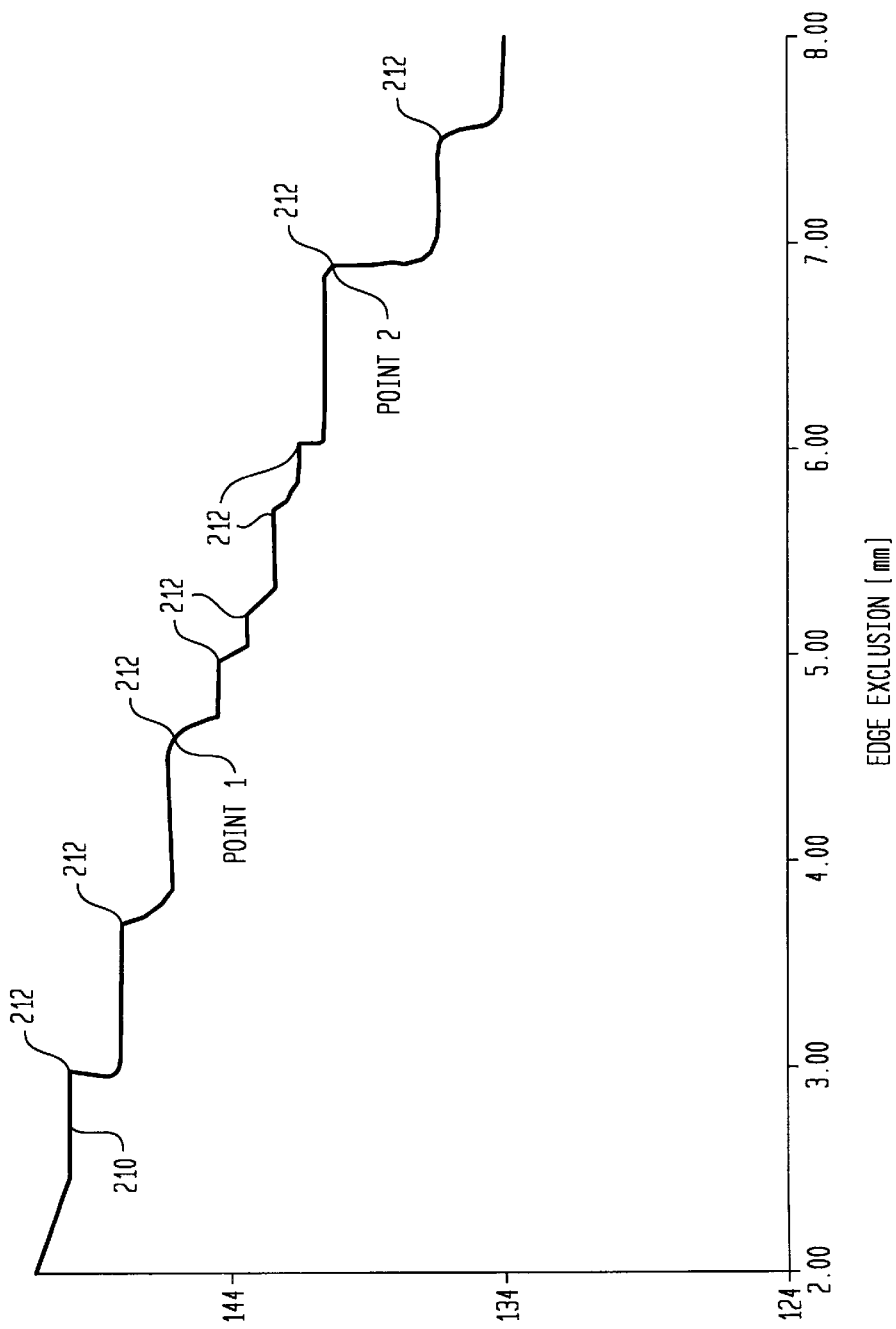
FIG. 2 is a plot showing chips per wafer versus edge exclusion for a typical wafer.

Referring now in specific detail to the drawings in which like reference numerals identify similar or identical elements throughout the several views, and initially to FIG. 2, the number of chips per wafer versus edge exclusion in millimeters is shown. The vertical axis of FIG. 2 shows the number of integrated circuit chips that can be fabricated from a wafer. The wafer is an eight inch wafer, for example. The horizontal axis of FIG. 2 represents the edge exclusion dimension for a given chip in millimeters. The range of the horizontal axis can be, for example, between 2 mm and 8 mm. This range is determined by wafer map center point 16 (FIG. 1) which is limited in its displacement due to the geometries of wafer map 20 and wafer 18. FIG. 2 is a plot of a curve 210 of a wafer modeler in which center point 16 of wafer map 20 was varied for a given edge exclusion until the maximum number of chips is determined. Generally, the variation shown in the maximum number of chips for a given edge exclusion decreases as the edge exclusion increases.

Of interest are corners 212 which are at the ends of horizontal line segments of curve 210. A horizontal line in FIG. 2 denotes no decrease in the number of chips for a given edge exclusion. This means that as the edge exclusion is increased the number of chips remains relatively constant over a given range of edge exclusion distance. This is typical for wafer modeling graphs which involve the circular geometry of the wafer and the rectangular shape of the chips. Several chips are deemed unusable simultaneously due to this geometrical mismatch. Referring to FIG. 1, as the edge exclusion distance (between point A and point B) is increased several chip corners, for example 12a, 12b and 12c, move deeper into exclusion zone 14 and are no longer deemed to be usable.

In order to demonstrate the method of the present disclosure two points have been designated in FIG. 2. Point 1, as indicated, shows that a wafer that is eight inches in diameter has a chip yield of 146 chips if an edge exclusion is 4.6 millimeters. Point 2, as indicated, shows that a wafer that is eight inches in diameter has a chip yield of 140 chips if an edge exclusion is 6.85 millimeters. Both of these chip yields represent the maximum possible number of chips allowable due to geometry. The wafer modeler moves wafer map 20 by its center point 16 to determine the maximum number of chips for wafer 10 given an edge exclusion. See FIG. 1. FIG. 2 illustrates the prior art technique of maximizing the number of chips on a wafer. Based on FIG. 2, it appears as though point 1 with a smaller edge exclusion would result in a higher yield, for example, 146 chips.

Figure 3:
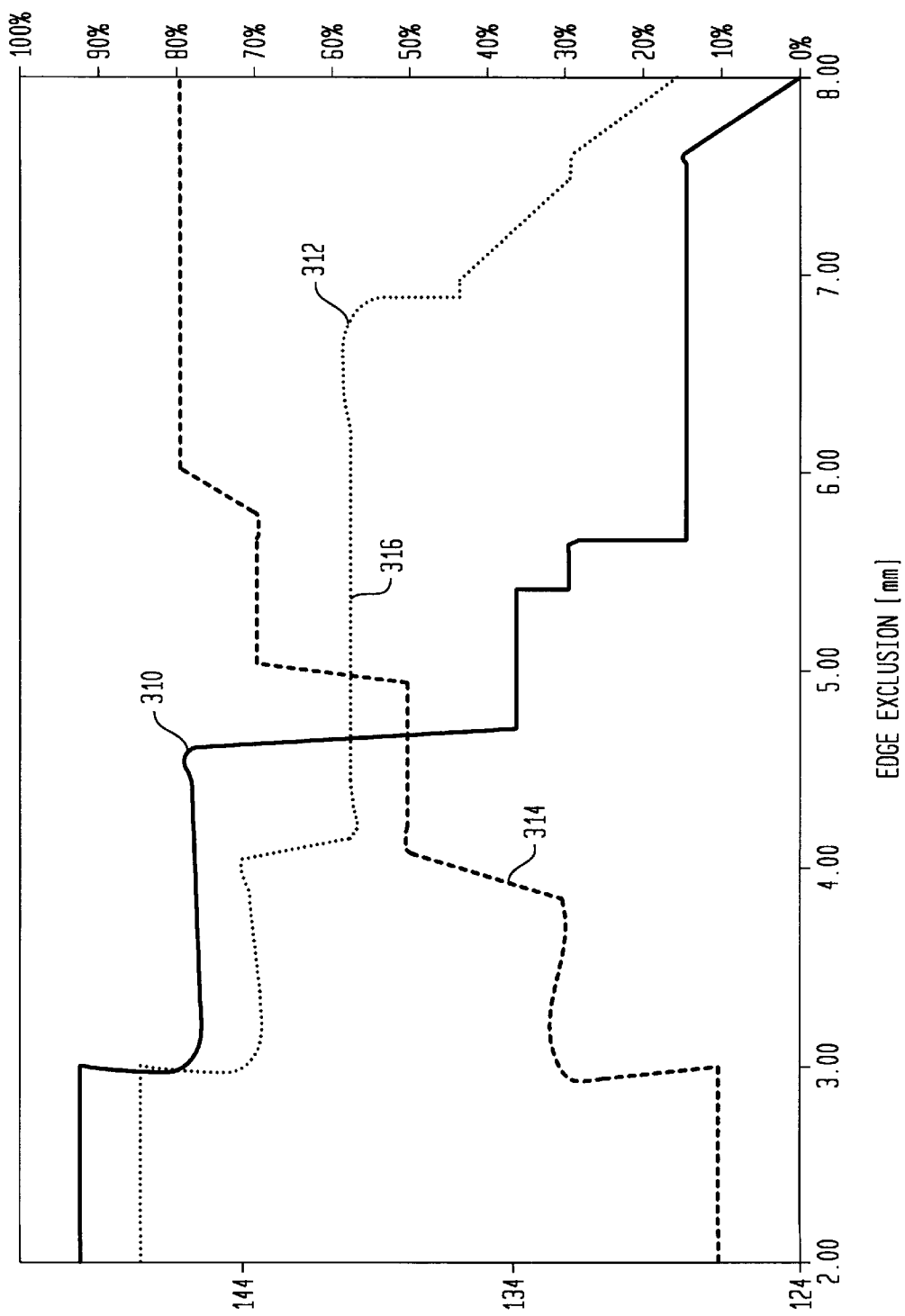
FIG. 3 is a plot showing chips per wafer on a left vertical axis and yield probability on a right vertical axis, both versus edge exclusion on a horizontal axis.

Referring to FIG. 3, a left vertical axis of FIG. 3 shows the number of integrated circuit chips that can be fabricated from a wafer. The wafer is an eight inch wafer, for example. A horizontal axis of FIG. 3 represents the edge exclusion for a given chip in millimeters. The range of the horizontal axis can be between 2 mm and 8 mm as in FIG. 2.

FIG. 3 illustrates the yield for a given edge exclusion when the center point of the wafer map is held fixed.

Three curves are shown in FIG. 3. A first curve 310 shows the chip yield per wafer over the range of edge exclusions with the center point fixed at the location determined by the wafer modeler for point 1 in FIG. 2. A second curve 312 shows the chip yield per wafer over the range of edge exclusions with the center point fixed at the location determined by the wafer modeler for point 2 in FIG. 2.

In maintaining a fixed center point and moving from smaller edge exclusions (2 mm) to larger edge exclusions (8 mm), it becomes apparent that the number of chips per wafer drops off more rapidly for curve 310 than curve 312 at an edge exclusion of approximately 4.6 mm. This drop off is a result of more chip area falling into area in which chips are normally rejected as the edge exclusions is increased. Although these chips are deeper into exclusion zone 14 (FIG. 1) they may still be useable. A method of identifying usable chips in the exclusion zone is outlined in more detail hereinafter.

Yield probability for an individual chip increases as the location of the chip is closer to the center of the wafer. This is illustrated by a curve 314. Curve 314 has a right vertical axis which denotes yield probability as a percent value. Curve 314 uses the same horizontal axis for edge exclusion as before. As illustrated by curve 314, yield probability increases for larger edge exclusions. Curve 314 is a typical yield probability curve for manufacturing chips.

Despite the higher number of chips per wafer given initially for point 1 in FIG. 2, the wafer map center point may have moved more chips closer to the edge of a wafer thereby decreasing the number of usable chips due to their location on the wafer (increased distance from wafer center, therefore decreasing their yield probability). Curve 312 illustrates that for larger edge exclusions a plateau 316 remains constant over the illustrated range of edge exclusions. This signifies a potential advantage to replacing the center point of the wafer map from the location corresponding to point 1 (146 chips available) to the location corresponding to point 2 (140 chips available) in FIG. 2 for wafers with larger edge exclusions. This determination is based on the overall yield of the chips including those in exclusion zone 14 (FIG. 1) and not just geometrically fitting wafer map 20 on wafer 10 and eliminating those chips that fall into the exclusion zone.

Figure 4:
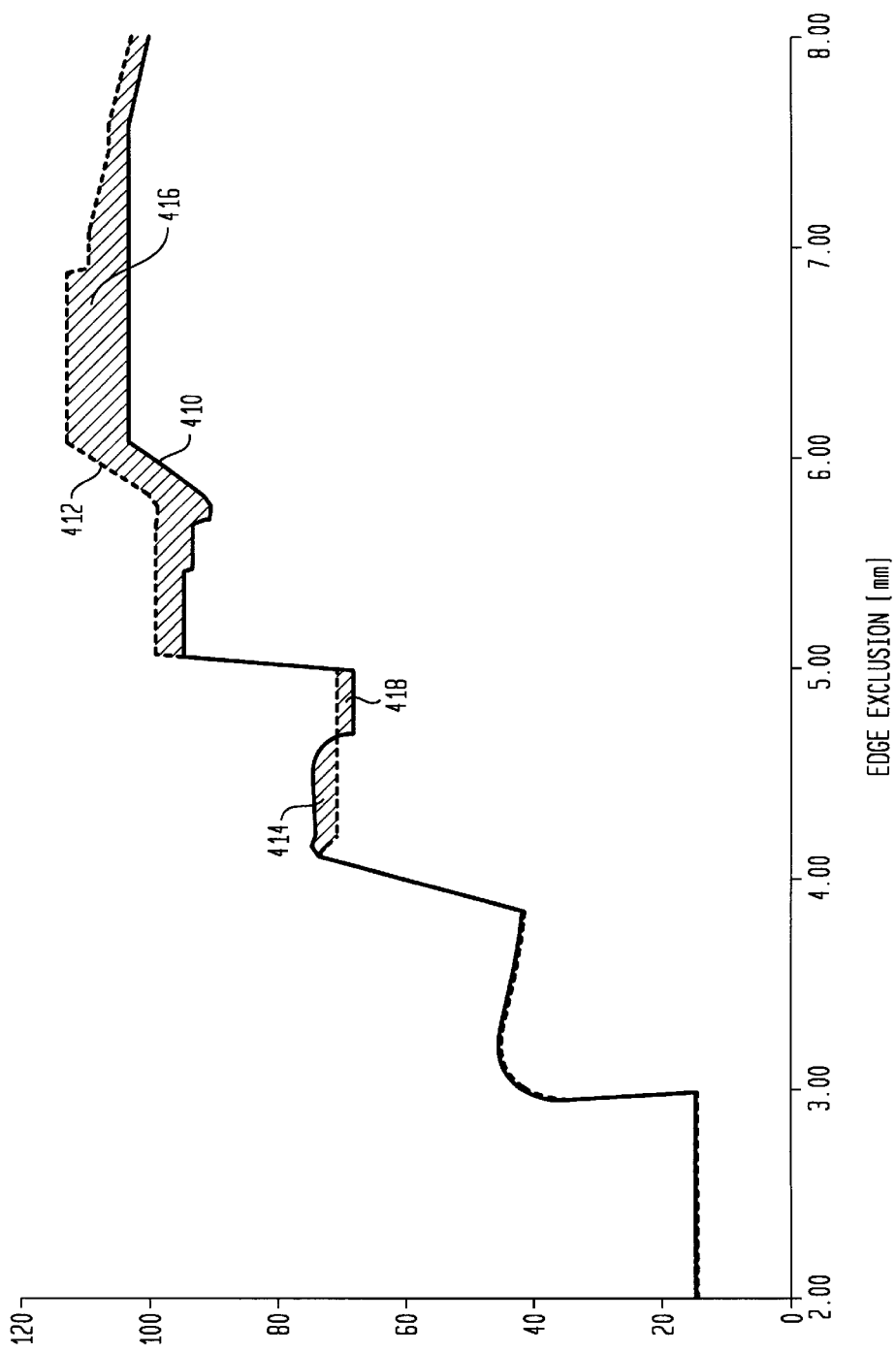
FIG. 4 is a plot of weighted yield probability versus edge exclusion.

Referring now to FIGS. 1 and 4, a comparison may be made between locations of wafer map 20 on wafer 10 which incorporates the yield probability into the placement of the wafer map center. A method for incorporating yield probability into the placement of the wafer map includes obtaining wafer map center locations on a wafer by determining corner points 212 as illustrated in FIG.2. This is completed by assuming a value for an edge exclusion and varying the center of the wafer map to determine which location will allow the most chips to fit within the bounds of the edge exclusion based on geometry alone. This determination can be performed by an appropriately programmed computer.

Upon determining corner points 212, a corresponding center point 16 for the wafer map is determined. Using the location of center points 16, curve 310 and 312 of FIG. 3 are generated for the center points 16 corresponding to point 1 and point 2 of FIG. 2. The generation of curves 310 and 312 can be performed by an appropriately programmed computer. Curves 310 and 312 are generated by fixing the center point 16 location and varying the edge exclusion to determine the number of chips that can fit within the bounds of the edge exclusion as in FIG. 3. Curves 310 and 312 (FIG. 3) are each multiplied by the yield probability curve 314 for the overall chip manufacturing process. Yield probability data at each edge exclusion dimension in FIG. 3 is multiplied by the corresponding value at the same edge exclusion value on the chips per wafer axis to obtain the plots shown in FIG. 4.

With further reference to FIG. 4, a curve 410 is generated as a result of yield probability curve 314 and curve 310 multiplication. A curve 412 is generated in a similar way but by multiplying curve 314 by curve 312. A comparison may now be made between two alternative placements of wafer map center point 16 which includes the overall yield of the chips. The area under curve 410 and curve 412 is taken in the edge exclusion range between 2 mm and 8 mm, for example. The greater value of the area under each curve gives the most favorable yield probability. The generation of curves 410 and 412 can be performed by an appropriately programmed computer, and the areas under curves 410 and 412 can be computed using a numerical integration program, for example. In FIG. 4, curve 412 gives a superior location for the center point of the wafer map. As graphically illustrated a region 414 and a region 416 exceed the area of region 418. Therefore, the location that would have been rejected in the prior art, for example point 2 of FIG. 1, provides a greater overall yield of usable chips since the location of the individual chips that would have been rejected may now be used based on the weight of the yield probability data which shows how successful a chip at a given location fares during acceptance testing.

The best overall yield is provided for a given wafer using the weighting of the yield probability curve. Rather than determining the maximum amount of chips per wafer based on a particular edge exclusion alone, chip yield data is used to adjust for the weighting of the location of the wafer map. Yield increases can range for example, from 1–3% for wafer sizes of eight inches although higher yields are contemplated. A chip located at a position that was normally rejected due to its location in an exclusion zone of a wafer can now be considered for use based on the yield probability associated with its position on the wafer. If the yield probability for the chip at this location is above an assigned threshold value the chip can be accepted for use, hence increasing the overall yield for a given wafer.

Having described embodiments of a method of maximizing the overall yield of chips per semiconductor wafer (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as delined by the appended claims. Having thus described the invention with the details and particularity required by the patent laws, what is claimed and desired protected by Letters Patent is set forth in the appended claims.

What is claimed is:

1. A method of fabricating semiconductor chips comprising the steps of:
    optimizing a number of chips that geometrically fit on a wafer; and
    maximizing chip yield for the wafer by:
        considering chips located in a normally rejectable location on the wafer;
        utilizing yield probability data for at least one of the chips in the normally rejectable locations to weigh the probability of an acceptable chip such that if the probability is above a threshold value for the at least one of the chips, the at least one of the chips is not rejected.

2. The method of fabricating semiconductor chips as recited in claim 1 wherein the step of optimizing a number of chips that geometrically fit on a wafer includes providing a predetermined wafer map for overlaying the wafer, the wafer map being referenced from a center point thereon; and maximizing a first quantity of chips that can fit on the wafer by varying the 3. The method of fabricating semiconductor chips as recited in claim 1 wherein the step of maximizing chip yield includes:
    determining the quantity of chips that can fit on the wafer by varying an edge exclusion distance with a wafer map fixed at a maximized center point location;
    providing a yield probability curve for wafer map locations;
    multiplying the yield probability curve by the quantity of chips at each of the wafer map locations to obtain a weighted yield probability curve for each wafer map center point location;
    comparing weighted probability curves for different wafer map center point locations; and
    selecting the wafer map center point location to maximize the chip yield for the wafer.

4. The method of fabricating semiconductor chips as recited in claim 1 wherein the wafer is about eight inches in diameter.

5. The method of fabricating semiconductor chips as recited in claim 1 wherein the steps of optimizing a number of chips that geometrically fit on a wafer and maximizing chip yield for the wafer are performed by a computer.

6. A method of fabricating semiconductor chips comprising the steps of:
    providing a predetermined wafer map for overlaying a wafer, the wafer map being referenced from a center point thereon;
    maximizing a first quantity of chips that can fit on the wafer by varying the center point of the wafer map on the wafer;
    recording a maximized wafer map center point location;
    determining the quantity of chips that can fit on the wafer by varying edge exclusion distances with the wafer map fixed at the maximized center point location;
    providing a yield probability curve for wafer map locations;
    multiplying the yield probability curve by the quantity of chips at each of the wafer map locations to obtain a weighted yield probability curve for each wafer map center point location;
    comparing weighted probability curves for different wafer map center point locations; and
    selecting the wafer map center point location to maximize the chip yield for the wafer.

7. The method of fabricating semiconductor chips as recited in claim 6 wherein the wafer is about eight inches in diameter.

8. The method of fabricating semiconductor chips as recited in claim 6 wherein edge exclusion distances vary between 2 millimeters and 8 millimeters.

9. The method of fabricating semiconductor chips as recited in claim 6 wherein the steps of multiplying the yield probability curve by the quantity of chips at each of the wafer map locations and comparing center point locations to maximize the chip yield for a wafer are performed by a computer.

10. A method of maximizing chip yield comprising the steps of:

determining a quantity of chips that can fit on a wafer by varying an edge exclusion distance with a wafer map fixed at a maximized center point location;

providing a yield probability curve for wafer map locations;

multiplying the yield probability curve by the quantity of chips at each of the wafer map locations to obtain a weighted yield probability curve for each wafer map center point location;

comparing weighted probability curves for different wafer map center point locations; and selecting the wafer map center point location to maximize the chip yield for the wafer.

11. The method as recited in claim 10, further comprising the step of maximizing the quantity of chips that can fit on the wafer by varying a center point of the wafer map on the wafer.

12. The method as recited in claim 10, wherein edge exclusion distances vary between 2 millimeters and 8 millimeters.

* * * * *